US009802401B2

United States Patent
Li et al.

(10) Patent No.: US 9,802,401 B2
(45) Date of Patent: Oct. 31, 2017

(54) FRAME ASSEMBLY, STENCIL, SCREEN PRINTING DEVICE AND SCREEN PRINTING METHOD

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Hu Li, Beijing (CN); Qing Zhang, Beijing (CN); Ming Hu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/166,500

(22) Filed: May 27, 2016

(65) Prior Publication Data
US 2017/0080699 A1    Mar. 23, 2017

(30) Foreign Application Priority Data
Sep. 18, 2015    (CN) .......................... 2015 1 0601647

(51) Int. Cl.
| | | |
|---|---|---|
| *B41N 1/24* | (2006.01) | |
| *B41F 15/34* | (2006.01) | |
| *B41C 1/14* | (2006.01) | |
| *B05C 17/06* | (2006.01) | |
| *H05K 3/12* | (2006.01) | |
| *G06F 3/041* | (2006.01) | |

(52) U.S. Cl.
CPC .............. *B41F 15/34* (2013.01); *B05C 17/06* (2013.01); *B41C 1/14* (2013.01); *G06F 3/041* (2013.01); *H05K 3/1225* (2013.01); *G06F 2203/04103* (2013.01)

(58) Field of Classification Search
CPC .. B41C 1/14; B41N 1/24; B41N 1/247; B05C 17/06; H05K 3/1225; B41F 15/34; B41F 15/36; G06F 3/041; G06F 2203/04103; B41M 1/12; B41P 2200/40; B41P 2215/12
USPC .................................. 101/127.1, 128; 33/566
See application file for complete search history.

(56) References Cited

U.S. PATENT DOCUMENTS

| | | | | |
|---|---|---|---|---|
| 2,334,913 A | * | 11/1943 | Eisenberg .............. | B26D 7/015 101/127 |
| 2,651,989 A | * | 9/1953 | Kerr ........................ | B05C 17/06 101/127 |
| 3,769,908 A | * | 11/1973 | Griffin ...................... | B41C 1/14 101/127 |

(Continued)

FOREIGN PATENT DOCUMENTS

| | | | | | |
|---|---|---|---|---|---|
| JP | 01022552 | * | 1/1989 | ............... | B41C 1/14 |
| JP | 06008396 | * | 1/1994 | ............... | B41F 15/34 |

(Continued)

*Primary Examiner* — Matthew G Marini
*Assistant Examiner* — Marissa Ferguson Samreth
(74) *Attorney, Agent, or Firm* — Nath, Goldberg & Meyer; Joshua B. Goldberg; Annie J. Kock

(57) ABSTRACT

The present invention provides a frame assembly, which comprises a first frame and a second frame provided to surround the first frame. The first frame and the second frame are configured to support mesh fabric therebetween.

8 Claims, 3 Drawing Sheets

(56) References Cited

U.S. PATENT DOCUMENTS

| | | | | |
|---|---|---|---|---|
| 5,193,457 A | * | 3/1993 | Hahn | B41M 1/12 101/127 |
| 7,156,017 B1 | * | 1/2007 | Ingraselino | B41M 1/12 101/115 |
| 2008/0098911 A1 | * | 5/2008 | Yanagihara | H05K 3/1225 101/127.1 |
| 2008/0302258 A1 | * | 12/2008 | Zhang | B05C 17/06 101/128.4 |
| 2010/0000428 A1 | * | 1/2010 | Chen | B41F 15/0818 101/123 |
| 2011/0226143 A1 | * | 9/2011 | Cudworth | B05C 17/06 101/127 |

FOREIGN PATENT DOCUMENTS

| | | | | |
|---|---|---|---|---|
| JP | 11157048 | * | 6/1999 | B41F 15/34 |
| JP | 2005-35056 | * | 2/2006 | B41N 1/24 |
| JP | 2009016457 | * | 1/2009 | H05K 3/34 |
| JP | 2010042613 | * | 2/2010 | B41C 15/36 |

* cited by examiner

… (1) …

FRAME ASSEMBLY, STENCIL, SCREEN PRINTING DEVICE AND SCREEN PRINTING METHOD

CROSS-REFERENCE TO RELATED APPLICATIONS

The present application claims the priority of Chinese Patent Application No. 201510601647.4, filed on Sep. 18, 2015, the contents of which are incorporated herein in their entirety by reference.

FIELD OF THE INVENTION

The present invention relates to the field of display technology, and in particular, relates to a frame assembly, a stencil, a screen printing device, and a screen printing method.

BACKGROUND OF THE INVENTION

FIG. 1 shows a structure of a touch panel including a visible area (VA) 1 and a black matrix (BM) area 2. The VA 1 includes a sensing unit made of indium tin oxide (ITO), a touch signal sensed by the sensing unit is transmitted to a flexible printed circuit (FPC) through traces in the black matrix 2, and further transmitted to an integrated circuit (IC) to be processed therein.

As shown in FIG. 2, a method for manufacturing the touch panel generally includes steps of: forming the sensing unit and the traces on a large glass substrate by an exposure process, a development process, and the like; cutting the large glass substrate to obtain a plurality of touch panels; and performing edge grinding, secondary screen printing and FPC bonding on each of the touch panels, so as to obtain a finished product. The secondary screen printing needs to be performed, because micro-cracks and notches will occur at an edge of each of the touch panels during the cutting and the edge grinding, damage the black matrix 2, and degrade the appearance of a product. Thus, a blank margin 3 having a width of about 0.5 mm will be introduced to each edge of the touch panels after the cutting and the edge grinding, and secondary screen printing is performed on the blank margin 3 of each edge of the touch panels after the edge grinding so as to print the blank margin 3 to be black.

FIG. 3 is a schematic diagram showing a screen printing device for secondary screen printing in the prior art, wherein, the peripheral blank area is a frame 41, mesh fabric 42 is provided inside the frame 41, the annular area in the mesh fabric 42 is an ink permeable area (also referred to as a "screen printing area") 43, when a scraper 44 is driven to scrape the mesh fabric 42 in the direction as shown by the arrow in FIG. 3, ink permeates through the ink permeable area 43 but cannot permeate through a non-screen-printing area. That is, ink is filled into a stencil before performing screen printing, and then the scraper is driven to scrape the mesh fabric to enable the ink in the ink permeable area 43 to permeate through the ink permeable area 43, so that ink is printed onto the blank margin 3 on a surface of a touch panel.

Inventors of the present invention found that there exist at least the following technical problems in the prior art. On one hand, in the printing method of the above secondary screen printing, a large part of the portion, scraped by the scraper, of the mesh fabric does not belong to the ink permeable area. As a result, a large amount of ink remains on the large part of the mesh fabric, and less than 30% of the ink is printed onto the blank margin 3 on a surface of a touch panel. Thus, the large amount of ink is wasted, and the larger a size of the touch panel is, the lower a utilization ratio of the ink for screen printing is. On the other hand, in order to prevent the ink for secondary screen printing from contaminating the visible area 1 of a touch panel, a protection film for protecting the visible area 1 is generally attached to the touch panel to cover the visible area 1 before performing screen printing. Although the protection film is very thin, it results in a non-negligible segment difference (i.e., unevenness of a surface). The segment difference resulted from the protection film may cause the ink for screen printing in the ink permeable area 43 to have nonuniform thicknesses, wherein, the ink in an area close to the protection film has a large thickness, whereas the ink in an area far away from the protection film has a small thickness. In a severe case, "ink accumulation" and "ink overflow" may occur, and there is a risk that the scraper 44 may easily damage the mesh fabric 42.

SUMMARY OF THE INVENTION

In view of the technical problems of ink waste and nonuniform thicknesses of scraped ink in the existing secondary screen printing, the present invention provides a frame assembly, a stencil, a screen printing device, and a screen printing method.

The present invention provides a frame assembly, including a first frame and a second frame provided to surround the first frame, wherein the first frame and the second frame are configured to support mesh fabric therebetween.

The present invention further provides a stencil, including the frame assembly as described above and mesh fabric provided between the first frame and the second frame, wherein, at least a part of the mesh fabric is an ink permeable area.

Optionally, the mesh fabric is made of polyester.

Optionally, the ink permeable area is provided to surround the first frame.

Optionally, the first frame is a rectangle.

The present invention further provides a screen printing device, including the stencil as described above and a scraper, wherein a width of the scraper is less than or equal to a width of a gap between the first frame and the second frame.

Optionally, the screen printing device is a screen printing device configured to perform secondary screen printing on a touch panel, the ink permeable area corresponds to a blank margin of the touch panel, a length and a width of the first frame are less than those of the touch panel, respectively, and a length and a width of the second frame are larger than those of the touch panel, respectively.

The present invention further provides a screen printing method, including a step of performing screen printing by the screen printing device as described above.

Optionally, the step of performing screen printing includes steps of:

providing a touch panel under the screen printing device, so that the ink permeable area corresponds to a blank margin of the touch panel; and driving the scraper to scrape the ink permeable area.

In a case where screen printing is performed by the screen printing device according to the present invention, since the second frame is provided to surround the first frame and the mesh fabric is provided between the first frame and the second frame, an area of the mesh fabric can be reduced. When the screen printing device according to the present invention is in use, ink only needs to be coated onto a portion of the mesh fabric which is located between the first frame and the second frame, and it only needs to drive the scraper to move a lap on the mesh fabric between the first frame and the second frame to cause the ink in the ink permeable area to be printed onto a blank margin of a touch panel. In the present invention, the mesh fabric needs not to be provided inside the first frame, thus an amount of material of the mesh fabric is reduced; in addition, the first frame has a hollow structure and will not bring contamination to the visible area of a touch panel, thus a protection film for protecting the visible area can be omitted, thereby eliminating a segment difference resulted from the protection film, and eliminating a risk that the scraper easily damages the mesh fabric. Furthermore, since an inner side and an outer side of the mesh fabric are fixed to the first frame and the second frame, respectively, forces applied to the mesh fabric are more uniform. As a result, when the scraper scrapes the mesh fabric, the scraped ink has a uniform thickness, and the quality of screen printing and a utilization ratio of the ink are increased. The screen printing device according to the present invention is applicable to performing screen printing on a touch panel.

DESCRIPTION OF REFERENCE SIGNS

1—visible area; 2—black matrix; 3—blank margin; 41—frame; 411—second frame; 412—first frame; 42—mesh fabric; 43—ink permeable area; 44, 44A—scraper.

DETAILED DESCRIPTION OF THE EMBODIMENTS

To make those skilled in the art better understand the technical solutions of the present invention, the present invention will be described below in detail with reference to the accompanying drawings and the following embodiments.

First Embodiment

Figure 4:
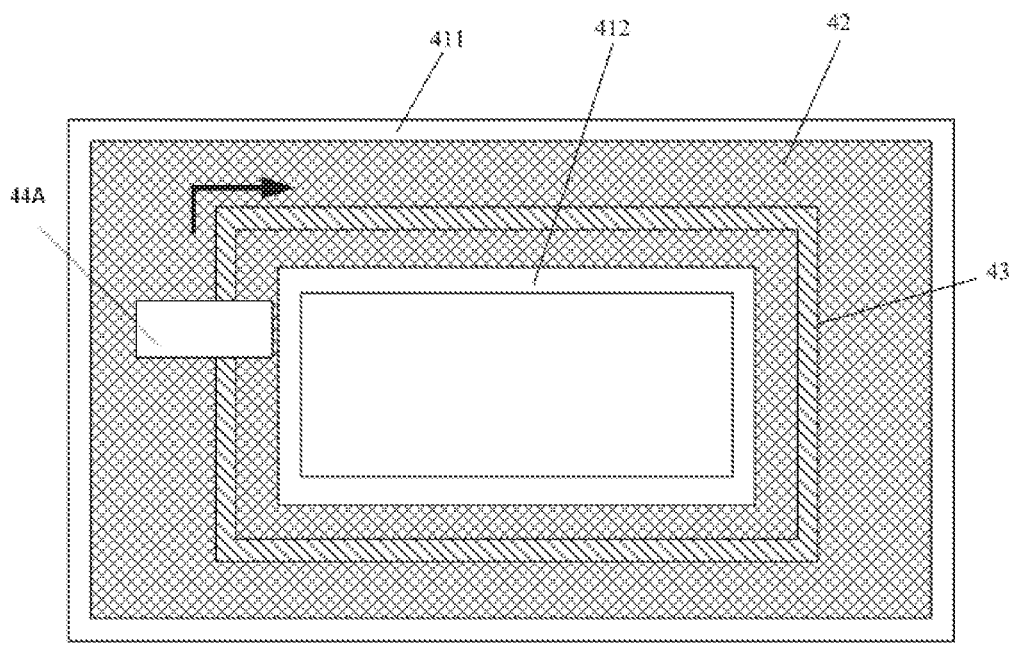
FIG. 4 is a schematic diagram showing a screen printing device according to a third embodiment of the present invention.

The present embodiment provides a frame assembly. As shown in FIG. 4, the frame assembly includes a first frame 412 and a second frame 411 provided to surround the first frame 412. The first frame 412 and the second frame 411 are configured to support mesh fabric 42 therebetween.
That is, a frame 41 in the prior art is in a shape of "□". However, the frame assembly according to the present embodiment includes the first frame 412 and the second frame 411 provided to surround the first frame 412, and thus is in a shape of " ▣ ". After mesh fabric 42 is provided between these two frames of the frame assembly, an inner side and an outer side of the mesh fabric 42 are fixed to the inner and outer frames (i.e., the first frame 412 and the second frame 411), respectively, thus the forces applied to the mesh fabric 42 are more uniform.

Second Embodiment

Figure 1:
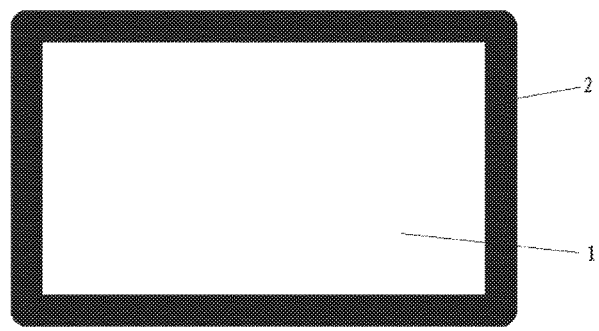
FIG. 1 is a schematic diagram showing a structure of a touch panel in the prior art.
Figure 2:
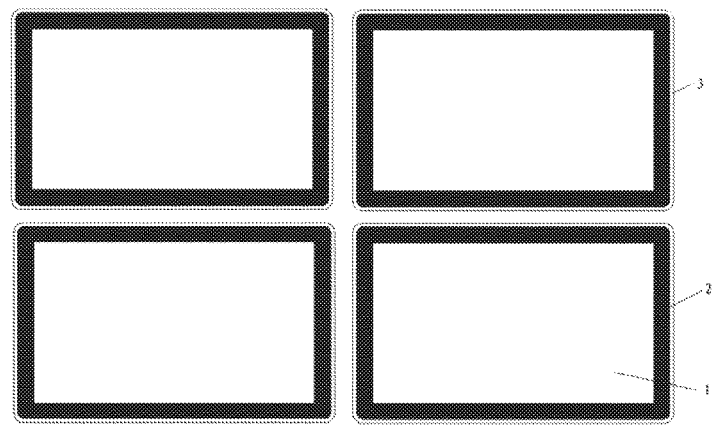
FIG. 2 is a schematic diagram showing a method for manufacturing the touch panel in the prior art.
Figure 3:
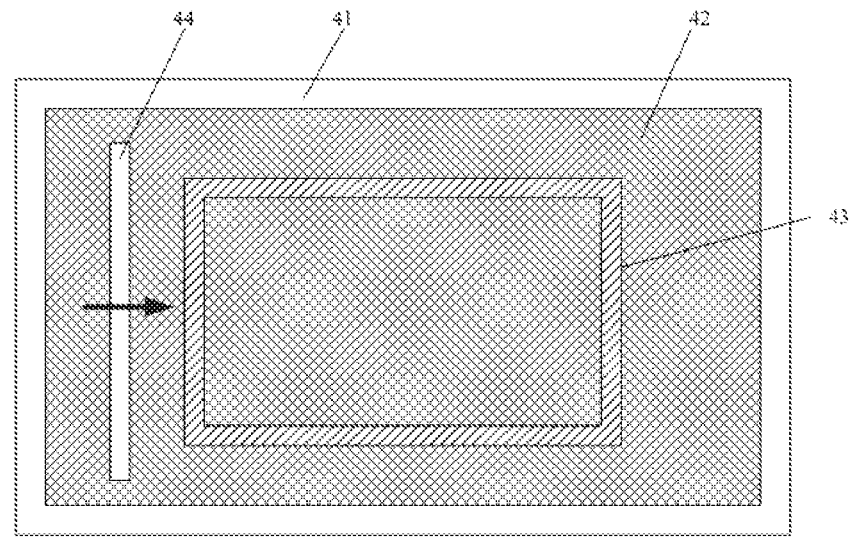
FIG. 3 is a schematic diagram showing a screen printing device for secondary screen printing in the prior art.

The present embodiment provides a stencil, which includes the frame assembly according to the first embodiment and the mesh fabric 42 provided between the first frame 412 and the second frame 411, wherein, at least a part of the mesh fabric 42 is an ink permeable area 43.
That is, in a screen printing device in the prior art, a scraper 44 moves horizontally, as shown by the arrow in FIG. 3. In the present embodiment, however, as shown in FIG. 4, the inner side and the outer side of the mesh fabric 42 are fixed to the first frame 412 and the second frame 411, respectively, and a scraper 44A moves a lap between the first frame 412 and the second frame 411 along the arrow as shown in FIG. 4. The mesh fabric 42 is not provided inside the first frame 412, and the first frame 412 has a hollow structure. Thus, no contamination will be brought to the visible area 1 of a touch panel, and a protection film for protecting the visible area 1 can be omitted. The forces applied to the mesh fabric 42 are more uniform, and when the scraper 44A scrapes the mesh fabric 42, ink permeates through the ink permeable area 43 uniformly.

Third Embodiment

Figure 5:
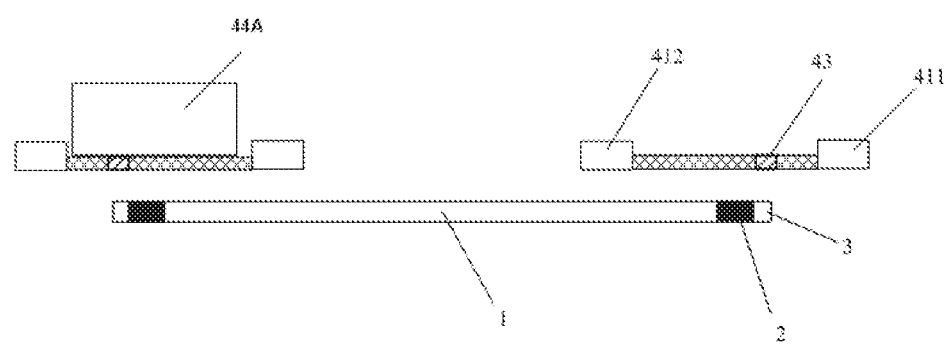
FIG. 5 is a schematic cross-sectional view showing the screen printing device according to the third embodiment of the present invention.

The present embodiment provides a screen printing device. As shown in FIGS. 4 and 5, the screen printing device includes the stencil according to the second embodiment and a scraper 44A, wherein a width of the scraper 44A is less than or equal to a distance between the first frame 412 and the second frame 411 (i.e., is less than or equal to a width of a gap between the first frame 412 and the second frame 411), such that the scraper 44A can be driven to move between the first frame 412 and the second frame 411 along the arrow as shown in FIG. 4.
That is, when the screen printing device according to the present embodiment is in use, ink only needs to be introduced onto a portion of the mesh fabric 42 which is located between the first frame 412 and the second frame 411, and then it only needs to drive the scraper 44A to move a lap on the mesh fabric 42 between the first frame 412 and the second frame 411 to cause the ink in the ink permeable area 43 to be printed onto the blank margin 3 of a touch panel. As described above, the mesh fabric 42 needs not to be provided inside the first frame 412, thus an amount of material of the mesh fabric 42 is reduced. In addition, the first frame 412 has a hollow structure and will not bring contamination to the visible area 1 of a touch panel, thus a protection film for protecting the visible area 1 can be omitted, thereby eliminating a segment difference resulted from the protection film, and eliminating a risk that the scraper 44A easily damages the mesh fabric 42. Furthermore, since the inner and outer sides of the mesh fabric 42 are fixed to the first frame 412 and the second frame 411, respectively, the forces applied to the mesh fabric 42 are more uniform. As a result, when the scraper 44A scrapes the mesh fabric 42, the scraped ink has a uniform thickness, and the quality of screen printing and a utilization ratio of the ink are increased. The screen printing device according to the present embodiment is applicable to performing screen printing on various touch panels.

Optionally, the mesh fabric 42 is made of polyester.

That is, after the mesh fabric 42 is scraped by the scraper 44A tens of thousands times, "ink accumulation" and "ink overflow" may occur. In order to avoid "ink accumulation" and "ink overflow," the mesh fabric 42 provided between the first frame 412 and the second frame 411 may be replaced with a new one. Since the mesh fabric 42 is made of polyester, a service life of the mesh fabric 42 can be extended.

Optionally, the ink permeable area 43 is provided to surround the first frame 412.

Optionally, the first frame 412 is a rectangle.

That is, as shown in FIG. 4, the ink permeable area 43 corresponds to the blank margin 3 on a surface of a touch panel. Generally, the ink permeable area 43 is a rectangular ring, and is provided to surround the first frame 412. As a result, forces imposed on the inner side of the mesh fabric 42 can be uniform.

Optionally, the screen printing device is a screen printing device configured to perform secondary screen printing on a touch panel, and the ink permeable area 43 corresponds to the blank margin 3 of the touch panel; a length and a width of the first frame 412 are less than those of the touch panel, respectively, and a length and a width of the second frame 411 are larger than those of the touch panel, respectively. In other words, the length of the first frame 412 is less than that of the touch panel, the width of the first frame 412 is less than that of the touch panel, the length of the second frame 411 is larger than that of the touch panel, and the width of the second frame 411 is larger than that of the touch panel.

That is, the inner side of the mesh fabric 42 is fixed to the first frame 412, and the outer side of the mesh fabric 42 is fixed to the second frame 411. The ink permeable area 43 is provided in the middle of the mesh fabric 42. With such configuration, the inner and outer sides of the mesh fabric 42 are subjected to uniform forces when the mesh fabric 42 is scraped by the scraper 44A, causing ink to permeate through the ink permeable area 43 uniformly.

Obviously, many variations may be made to details in the foregoing embodiments. For example, a size of the first frame 412 or the second frame 411 may be adjusted according to a practical application, a width of the mesh fabric 42 or the ink permeable area 43 may be adjusted according to different products to which the present is applied, and the like.

Fourth Embodiment

The present embodiment provides a screen printing method, including a step of performing screen printing by the screen printing device as described above.

Optionally, the step of performing screen printing specifically includes steps of: providing a touch panel under the screen printing device, so that the ink permeable area 43 corresponds to the blank margin 3 of the touch panel (as shown in FIG. 5); and driving the scraper 44A to scrape the ink permeable area 43 of the mesh fabric 42. It is apparent to a person skilled in the art that, prior to the step of driving the scraper 44A to scrape the ink permeable area 43 of the mesh fabric 42, the screen printing method further includes a step of coating ink on the mesh fabric 42.

When screen printing is to be performed, ink only needs to be introduced onto a portion of the mesh fabric 42 which is located between the first frame 412 and the second frame 411, and then the scraper 44A is driven to move a lap, along the frame assembly in the shape of "回", on the mesh fabric 42 between the first frame 412 and the second frame 411, to cause the ink in the ink permeable area 43 to be printed onto the blank margin 3 on a surface of a touch panel.

It should be understood that, the foregoing embodiments are only exemplary embodiments used for explaining the principle of the present invention, but the present invention is not limited thereto. Various variations and improvements may be made by a person skilled in the art without departing from the protection scope of the present invention, and these variations and improvements also fall into the protection scope of the present invention.

What is claimed is:

1. A stencil, comprising
a frame assembly comprising a first frame and a second frame provided to surround the first frame, wherein the first frame and the second frame are configured to support mesh fabric therebetween; and
mesh fabric provided between the first frame and the second frame, wherein, at least a part of the mesh fabric is a screen printing area, the mesh fabric is not provided inside the first frame, and the first frame has a hollow structure.

2. The stencil according to claim 1, wherein the mesh fabric is made of polyester.

3. The stencil according to claim 1, wherein the screen printing area is provided to surround the first frame.

4. The stencil according to claim 1, wherein the first frame is a rectangle.

5. A screen printing device, comprising the stencil according to claim 1 and a scraper, wherein a width of the scraper is less than or equal to a width of a gap between the first frame and the second frame.

6. The screen printing device according to claim 5, wherein, the screen printing device is a screen printing device configured to perform secondary screen printing on a touch panel, the screen printing area corresponds to a blank margin of the touch panel, a length and a width of the first frame are less than those of the touch panel, respectively, and a length and a width of the second frame are larger than those of the touch panel, respectively.

7. A screen printing method, comprising a step of performing screen printing by the screen printing device according to claim 5.

8. The screen printing method according to claim 7, wherein, the step of performing screen printing comprises steps of:
providing a touch panel under the screen printing device, so that the screen printing area corresponds to a blank margin of the touch panel; and
driving the scraper to scrape the screen printing area.

* * * * *